United States Patent [19]

Kallmeyer et al.

[11] 4,342,935
[45] Aug. 3, 1982

[54] BINARY PIEZOELECTRIC DRIVE FOR LENS FOCUSING SYSTEM

[75] Inventors: Michael Kallmeyer, Boeblingen; Hans Rösch, Reutlingen; Claus Scheuing, Lorch; Bernhard Solf, Sindelfingen, all of Fed. Rep. of Germany

[73] Assignee: Discovision Associates, Costa Mesa, Calif.

[21] Appl. No.: 139,033

[22] Filed: Apr. 10, 1980

[51] Int. Cl.³ .................. H01L 41/08; G11B 7/00
[52] U.S. Cl. ................... 310/328; 310/369; 369/45; 369/112
[58] Field of Search ............... 310/328, 311, 330–332, 310/369; 356/106 LR, 153, 351; 369/45, 112, 122

[56] References Cited

U.S. PATENT DOCUMENTS

| 3,153,229 | 10/1964 | Roberts | 310/328 X |
| 3,315,103 | 4/1967 | Duff et al. | 310/328 |
| 3,947,708 | 3/1976 | Fulenwider | 310/330 |
| 4,092,529 | 5/1978 | Aihara et al. | 369/45 X |
| 4,160,184 | 7/1979 | Ljung | 310/328 |
| 4,193,091 | 3/1980 | Kleuters et al. | 369/45 |
| 4,302,830 | 11/1981 | Hamaoka et al. | 369/45 |

FOREIGN PATENT DOCUMENTS

| 52-35994 | 3/1977 | Japan | 310/328 |
| 54-146612 | 11/1979 | Japan | 369/45 |
| 55-42368 | 3/1980 | Japan | 369/45 |

*Primary Examiner*—Mark O. Budd
*Attorney, Agent, or Firm*—Ronald J. Clark

[57] ABSTRACT

A deflection arrangement is described which comprises several piezocrystal elements which are separately driven by a positive or a negative voltage. In this configuration, there is no elastic hysteresis. The arrangement is particularly suitable for automatic focusing systems.

8 Claims, 6 Drawing Figures

BINARY PIEZOELECTRIC DRIVE FOR LENS FOCUSING SYSTEM

BACKGROUND OF THE INVENTION

1. Field of the Invention

The invention relates generally to a piezoelectric drive arrangement, and more particularly, to a piezoelectric drive arrangement usable in automatic focusing systems or general deflection and deviation systems.

2. Description of the Prior Art

Known from German Offenlegungsschrift No. 25 24 854 is a piezoelectric drive arrangement for a mosaic print head, which consists of two flat, elongated piezoelectric transducers which are undetachably connected to each other and which are arranged in layers one on top of the other. Both transducers have a common control electrode to which a control potential is applied. The respective counterelectrodes are connected to a constant potential.

Known from German Offenlegungsschrift No. 25 24 893 is, furthermore, a mosaic print head with piezoelectric drive elements which, after the electrodes have been subjected to an electric field changing in steps, move away from a large stationary mass, causing an image to be printed on the record carrier as a result of their mass moment of inertia.

In German Offenlegungsschrift No. 24 26 331 a piezoelectric light beam deflector is described which has a mirror pivotable about an axis. This axis is supported between the ends of two piezoelectric disks. In the case of an oppositely directed length change of the two disks, resulting from the application of electric voltages, the axis moves along the surfaces of the disk.

In German Offenlegungsschrift No. 27 10 935 a matrix printer with piezoelectrically driven print needles is described. This printer is provided with a buckling spring deflectable in response to an electrically controlled expansion of a piezocrystal arrangement. This piezocrystal arrangement consists of piezocrystal elements which are arranged one behind the other in the direction of polarization and which have two pole faces each. The piezocrystal elements are arranged in such a manner that the pole faces of the same polarization polarity are aligned to each other. All pole faces with a positive polarization polarity are connected to the negative pole of a control voltage source, whereas the other pole faces with a negative polarization polarity are connected to the positive pole of this control voltage source. Thus, the same control voltage is applied to each piezocrystal element. The partial expansions of the individual piezocrystal elements add up to a desired stroke when the piezocrystal elements are correspondingly controlled by means of control pulses.

Also known are a plurality of focusing systems, wherein optical means have to be readjusted for focusing, for example, a light beam at a particular point. Such arrangements are known, for example, from German Offenlegungsschriften Nos. 27 53 436, 20 12 995, and 26 56 730.

In addition, in the publication "Disk" (Tentative B-900 ) by Robert Bosch GmbH, Geschäftsbereich Fernsehanlagen, Darmstadt/Deutschland, a "Professional Optical Video Disk System" is described, whereby for the production of video image disks, information is written onto the video disk by means of a laser beam. As slight falsifications of the video image have no detrimental effect, no extremely high resolutions are required for the focusing system for focusing the laser beam. Therefore, the focusing arrangement can be realized by means of light, and thus cheaper, lenses (no quality lenses) and by means of a moving coil drive suitable for such light lenses.

SUMMARY OF THE INVENTION

The present invention is directed to a piezoelectric drive system for generating controlled deflections with a high resolution. This drive system is to be used in particular for the lens control of a high resolution focusing system.

For an extremely high resolution of data recorded on a rotating information carrier by means of a laser beam, the laser beam has to be extremely accurately focused. For such purposes, focusing arrangements with light lenses and the moving coil drives used therefor are no longer suitable; to obtain a higher resolution, better, i.e., heavier, lenses would have to be used which could no longer be driven without problems by moving coil drives.

The depth of focus of known control systems is of the order of $\pm 1$ $\mu$m, whereas the depth of focus for maximum resolution data recording is much less ($\pm 0.1$ $\mu$m).

The problem of providing a piezoelectric drive element for controlled strokes of maximum resolution and maximum speed (which are only limited by the mechanical reference constant of the controlling element) is solved by the present invention.

The high resolution required is obtained, for example, by a hysteresis-free, binarily graded control of the expansion of the piezocrystal element.

The high speed is obtained by eliminating the additional delay period caused by the hysteresis. The application of a field to obtain a desired expansion and the reduction of the field to the value 0, as is usual with known arrangements, were accompanied by the known hysteresis effect of piezoelectric materials. Finest gradations in the movement of increasing and/or decreasing deflections could only be effected by analogously controlling the elastic hysteresis. As in analogous control systems a hysteresis leads to a delay period, such control would be slowed down by the delay period attributable to the hysteresis. The usual analogous control systems used for the control of conventional piezocrystal elements are too slow for the application described (time constant about 5 to 10 ms, i.e., a control frequency of 100 to 200 c/s). A moving coil drive for a better, i.e., heavier, lens would not meet these requirements.

These and other features of the present invention will become apparent from the detailed description set forth hereinafter.

DESCRIPTION OF THE PREFERRED EMBODIMENT

Figure 1:
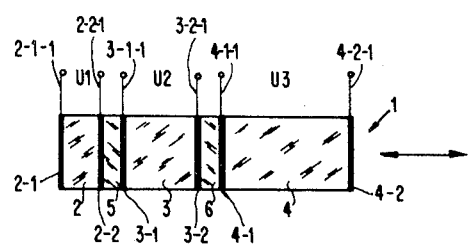
FIG. 1 is a schematic representation of three piezocrystal elements which are arranged one behind the other, which can be separately electrically controlled, and the individual expansions of which add up to a total expansion.

FIG. 1 is a simplified representation of a piezoelectric drive arrangement 1. This arrangement consists of three piezocrystal elements 2, 3, 4 which are arranged one behind the other and which are separated from each other by insulating elements 5, 6. Each of the piezocrystal elements 2, 3, 4 is provided with metallized pole faces. The insulating elements 5, 6 are made of glass which is metallized on the sides facing the pole connecting faces of the piezocrystal elements. The metallized pole faces of the piezocrystal elements, the metallized side faces, and the contact lamellae for the electric lines are designated as 2-2, 3-1, 3-2, 4-1; the pole connecting faces and the contact lamellae at the end faces of the piezoelectric drive arrangement 1 are designated as 2-1 and 4-2. All parts 2, 5, 3, 6, 4 of the arrangement 1 are glued to each other. The adhesive used is preferably an electrically conductive adhesive. Upon application of a suitable control voltage, the length of the piezocrystal element changes in the direction of the arrow. Thus, for example, the control voltage $U_1$ can be applied to the pole connecting faces 2-1 and 2-2 of the piezocrystal element 2 via the lines 2-1-1 and 2-2-1. This holds in analogy for the control voltage $U_2$ which is applied to the pole connecting faces 3-1 and 3-2 of the piezocrystal element 3 via the lines 3-1-1 and 3-2-1 or for the control voltage $U_3$ which is applied to the pole connecting faces 4-1 and 4-2 of the piezocrystal element 4 via the lines 4-1-1 and 4-2-1. Upon application of the individual control voltages to the piezocrystal elements, the following length changes occur in the direction of the electric field. As the individual piezocrystal elements are arranged one behind the other, their length changes add up. The total length change of the arrangement 1, which occurs in response to the application of the control voltages $U_1$, $U_2$, $U_3$, is to be of a particular value in each case. Proceeding from a given deflection, a new deflection representing a decrease or increase of the original deflection is to be obtained by changing the combination of the control voltages. In a simple embodiment the electric field strengths produced by the control voltages $U_1$, $U_2$, and $U_3$ in the piezocrystal elements 2, 3, 4 can be of the same magnitude, whereas the dimensions of these piezocrystal elements may differ in the direction of deflection. In this manner, the partial deflections of the individual piezocrystal elements differ at the same electric field strength. Thus, different total deflections are obtainable by suitably combining the piezocrystal elements to be controlled. These total deflections are obtained by adding the deflections of the individual piezocrystal elements. Assuming that there is a linear relation between the electric field strength and the length change of a piezocrystal element, an arrangement in accordance with FIG. 1 could be designed in such a manner that the dimensions of the individual piezocrystal elements 2, 3, 4 are binarily graded in the direction of deflection. This means, the element 3 is twice ($2^1$ times) the size of element 2, while the element 4 is four ($2^2$) times the size of element 2. To obtain equal field strengths in the piezocrystal elements 2, 3, 4, the ratio of the individual control voltages $U_1$, $U_2$, $U_3$ is 1:2:4. By suitably combining the piezocrystal elements to be energized, different total deflections can be obtained: The length change is smallest when only element 2 is energized; it is greatest when all elements 2, 3, 4 are energized. In accordance with the binary multiplicity of 3 elements, the maximum number of total deflections obtainable is $2^3$. To each piezocrystal element, e.g., 2, either the positive value of the control voltage $U_1 \triangleq$ LOGICAL '1' or the negative value $-U_1 \triangleq$ LOGICAL '0' can be applied. As a result, an electric field strength of opposite direction is obtained in the piezocrystal element. This is important in connection with digitalized, high resolution motional sequences and ensures a hysteresis-free deflection of the piezocrystal element.

Figure 2:
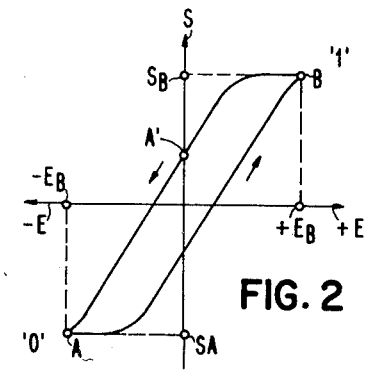
FIG. 2 is a schematic representation of a hysteresis loop for the expansion of a single piezocrystal element as a function of the control field strength.

The elastic hysteresis phenomenon encountered with piezocrystal elements when a control voltage is applied is known per se. This phenomenon is attributable to the fact that a control voltage applied to the piezocrystal element leads to a field strength of a particular direction being built up and that after this control voltage has been switched off, the length change of the element does not return to zero but assumes a value corresponding to point 'A' (see FIG. 2). In other words, as the electric field strength disappears, the piezocrystal element does not readopt its original dimension but a value above or below the same. Because of this hysteresis phenomenon, digital piezoelectric drive systems are unsuitable for high resolution deflections. Therefore, for high resolution systems, the operating points of a piezocrystal element at which deflections occur are defined as A and B, in accordance with the hysteresis shown in FIG. 2. For a positive control voltage (e.g., $+U_1$) a positive field strength $E_B$ and thus a deflection $s_B$ is to occur in the piezocrystal element, in accordance with the end point B of the hysteresis loop. For a negative field strength $-E_B$, the original dimension of the piezocrystal element is reduced by the value $s_A$, in accordance with the other end point A of the hysteresis loop. The operating points A and B (equivalent to a logical '1' and '0', respectively), which correspond to the hysteresis end points, are clearly defined; a field-free piezocrystal element is no longer encountered, thus eliminating the disadvantageous hysteresis phenomenon. This principle of operating piezoelectric drive arrangements hysteresis-free also holds for other arrangements, not shown. It is conceivable, for example, to subject individual, piezocrystal elements arranged one behind the other and having the same dimensions in the direction of expansion to different control voltages leading to different electric field strengths. It must be ensured that the control voltage for a piezocrystal element in such an arrangement has a positive and a negative value of the same absolute magnitude and that the control voltage has a magnitude which is sufficient to obtain the operating points A, B of the hysteresis.

Also conceivable are arrangements in which both the dimensions of the individual piezocrystal elements in the direction of deflection and the electric field strengths generated in the individual piezocrystal elements vary, in order to generate predetermined total deflections.

Figure 3:
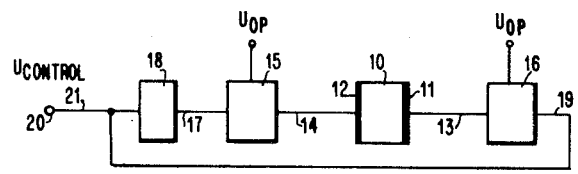
FIG. 3 is a schematic representation of the control of a single piezocrystal element via driver circuits and an inverter.

FIG. 3 shows a basic circuit diagram of a control circuit which simultaneously serves to explain a further advantage of piezocrystal elements which are controlled hysteresis-free. In this representation the piezocrystal element is designated as 10 and its two pole connecting faces as 12 and 11. The pole connecting face 12 is connected to a driver circuit 15 via a line 14; the pole connecting face 11 is connected to a second driver circuit 16 via a line 13. These driver circuits 15 and 16 serve to connect a voltage $U_{op}$ (e.g., +300 V) or a mass (=0 V) to the pole connecting faces of the piezocrystal element upon the occurrence of a logical input signal $\pm U_{control}$ (indicating a logical '1' or a logical '0').

The deflection difference of the piezocrystal element 10, which occurs when a positive or negative logical control voltage $\pm U_{control}$ is applied, will be described below. In the first case (according to FIG. 4A) this positive control voltage is fed to the input of the driver circuit 15 via the line 21 and 19. Then, the voltage $U_{op}$ (e.g., =300 V) is applied from the driver circuit 16 via the line 13 to the pole connecting face 11 of the piezocrystal element 10. By means of the inverter 18, the positive control voltage is negated to form a negative control voltage, the pole connecting face 12 of the piezocrystal element 10 being connected to ground by the driver circuit 15 via the lines 14. Thus, a voltage of +300 V is applied across the piezocrystal element in accordance with the representation of FIG. 4A.

Figures 4A, 4B:
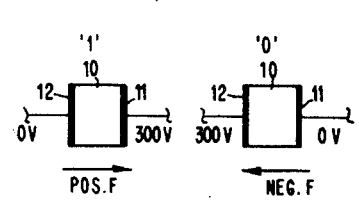
FIGS. 4A and 4B are a schematic representation of a single piezocrystal element for determining its operating points by means of a positive and a negative electric field, and, FIG. 5 is a schematic representation of an embodiment of a piezoelectric drive arrangement consisting of a plurality of piezoelectric rings separated from each other by glass rings.

In the other case, that means upon the occurrence of a negative control voltage $-U_{control}$, the inverter 18 preceding the driver 15 causes the pole connecting face 12 of the piezocrystal element 10 in accordance with FIG. 4B to be subjected to 300 V, whereas the pole connecting face 11 is connected to ground via the driver circuit 16. Thus, the logical operating points '1' and '0' are obtained for FIGS. 4A and 4B, respectively. These points correspond to those (B and A) in the hysteresis representation in FIG. 2. Consequently, the difference in the expansions of the piezocrystal element is obtained by means of a control voltage of only 300 V, for example. To obtain the same change in expansion for a control subject to hysteresis, it would be necessary to use twice this control voltage, namely, 600 V, thus making greater demands upon the semiconductor control circuits.

Figure 5:
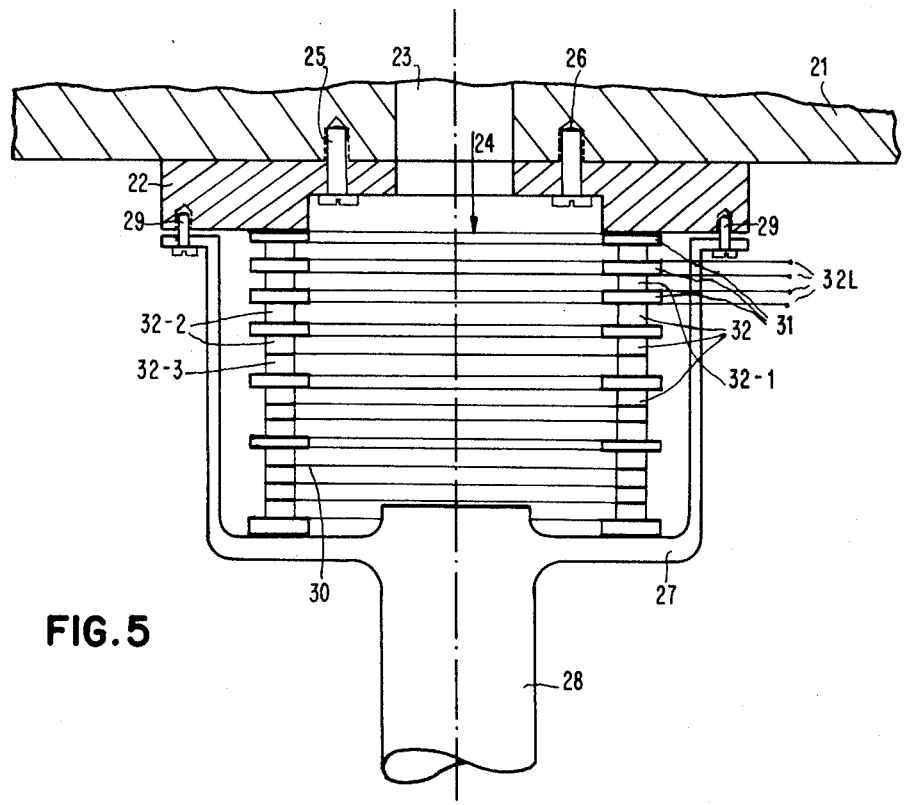

FIG. 5 shows a practical example of a piezoelectric drive arrangement. This arrangement is designated as 30. It consists of a plurality of ring-shaped piezocrystal elements 32 separated from each other by ring-shaped glass elements 31. The contact faces of the piezocrystal elements and the insulating glass rings are metallized in each case. Reliable contact is ensured by lines which are metallically conductively glued to the metallization of the glass elements. The glass elements protrude from the piezocrystal elements, thus permitting access for sticking on the supply line. The design of the piezoelectric arrangement 30 is chosen in such a manner that the individual expansion of one or several piezocrystal elements arranged between two glass rings is binarily graded. The partial expansions can be obtained either by varying the dimension of the piezocrystal elements in the direction of deflection or by varying the magnitude of the electric field for the individual piezocrystal elements. It is also possible to arrange several piezocrystal elements one behind the other, e.g., 32-2 and 32-3, between two insulating glass elements and to control these elements in parallel to obtain a particular partial expansion. To simplify the representation, the electric supply lines for controlling the individual piezocrystal elements are shown only in part. All piezocrystal elements and insulating glass elements are permanently glued to each other. The adhesive used is an electrically conductive two-component adhesive. The end faces of the arrangement 30 are glued to the housing parts 22 and 27 by means of a non-conductive two-component adhesive. The arrangement in accordance with FIG. 5 serves to control a lens arranged in a space 28 for use in automatic focusing systems. Via a flange 22 and two screws 25 and 26, the piezoelectric drive arrangement 30 is flanged to a housing wall 21. The housing wall 21 as well as the flange 22 have a joint aperture 23 permitting the light beam to pass in the arrow-marked direction. For safety reasons, the lens holder 27 permanently connected to one end of the arrangement 30 is bent, being loosely suspended from flange 22 via connecting elements 29. This prevents the arrangement 30 and the lens holder from dropping out as a result of an undesirable rupture of the adhesive joint.

The previously described piezoelectric drive arrangement can be used to particular advantage in focusing systems for recording data on a rotating disk by means of a laser beam. At a correspondingly high predetermined data density, the laser beam must be very accurately focused on to the disk surface. Such focusing requires a quality lens with a relatively high weight. As the laser beam must invariably be accurately focused on to the surface of the rotating disk, the lens has to be adjusted as a result of irregularities of the disk surface. For high resolution systems, conventional moving coil drives are unsuitable. Photoelectric arrangements for detecting irregularities of the disk surface are known, so that a detailed description can be omitted. Such arrangements supply a signal analogous to the degree of the irregularity. This signal is used to adjust the lens, so that the laser beam is accurately focused on to the surface of the rotating record carrier. For adjusting or controlling the lens, the initially analogous signal is digitalized in accordance with the invention. As a function of the value of this digitalized signal, the individual piezocrystal elements to be controlled are selected via a decoder (not shown) in such a manner that the lens is controlled by adding the individual expansions of the piezocrystal elements. As an accurate and high-speed (digital) control of the lens necessitates that the latter is permanently controlled in one direction or opposite thereto relative to particular position values, such control must be hysteresis-free for high resolution systems. The lens can be controlled either in a closed control loop or as a function of deviation values previously measured and stored for a disk revolution.

Data previously recorded on a record carrier by means of a laser beam are read by focusing the laser beam on to the record carrier. The information is read in a conventional manner by evaluating the differing transmission behaviour of the beam with respect to the record carrier.

Similarly designed binarily graded and digitally controlled piezocrystal elements can be used for any deflection and deviation methods requiring high resolutions, freedom from hysteresis, and maximum deflection and deviation speeds.

The arrangement described can be used to particular advantage in processor-controlled positioning systems (e.g., precision control for measuring tables at a resolution amounting to a fraction of the interferometer wavelength). As a result of the digitalized control and the digitalized recording of the measuring values, further analogue-to-digital-conversion or vice versa is eliminated.

It will be apparent from the foregoing that, while a particular embodiment of the invention has been illustrated and described, various modifications can be made without departing from the spirit and scope of the invention. Accordingly, it is not intended that the invention be limited, except as by the appended claims.

What is claimed is:

1. A high resolution focusing system usable in connection with a focusing lens for controlling the position along an optical axis of the form point of a beam of light passing through said lens in the direction of said axis, comprising:
    a support structure having an opening through which said light beam passes;
    a lens holder for holding said focusing lens; and
    a piezoelectric driver coupling said lens holder to said support structure for imparting controllable relative motion to said lens holder with respect to said support structure, said piezoelectric driver comprising:
        a plurality of annularly shaped piezocrystal members each having oppositely facing annularly shaped electrical contact faces,
        a plurality of rigid annularly shaped insulating members in contact with and separating said piezocrystal members from one another, such that said piezocrystal members and said insulating members form a hollow cylindrical composite structure, the opposite ends of which are attached to said support structure and said lens holder, respectively, such that said light beam passes through the center of said cylindrical structure substantially coaxially therewith, and also passes through said lens, and
    electrical drive means coupled to the contact faces of said piezocrystal members for supplying a control signal to, and thereby controlling the lengths of, said piezocrystal members to thereby control the relative position of said lens with respect to said support structure.

2. A high resolution focusing system as recited in claim 1, and further including:
    means for selectively applying a positive and a negative voltage across each of said piezocrystal members for obtaining a temporary expansion and contraction, respectively, along said optical axis.

3. A high resolution focusing system as recited in claim 1, wherein
    each of said piezocrystal members has different dimensions in their direction of change along said optical axis.

4. A high resolution focusing system as recited in claim 1, wherein
    each of said piezocrystal members has the same dimensions in the direction of change along the optical axis.

5. A high resolution focusing system as recited in claim 1, 3, or 4 wherein
    each of said electric control voltages for each piezocrystal member is of the same absolute magnitude.

6. A high resolution focusing system as recited in claim 1, 3, or 4 wherein
    each of said electric control voltages for each piezocrystal member is of different absolute magnitudes.

7. A high resolution focusing system as recited in claim 1 wherein
    said length changes of the piezocrystal elements are binarily graded.

8. A high resolution focusing system as recited in claim 1, wherein said electrical drive comprises
    digital signal means for controlling the piezoelectric drive arrangement; and
    decoder means for generating digital control voltages for each of the said piezocrystal elements.

* * * * *